United States Patent [19]

Hiroshima et al.

[11] Patent Number: 5,462,512
[45] Date of Patent: Oct. 31, 1995

[54] PRINTED CIRCUIT BOARD WORKING MACHINE

[75] Inventors: Yasunori Hiroshima; Kenji Kondo, both of Tokyo, Japan

[73] Assignee: Pioneer Electronic Corporation, Tokyo, Japan

[21] Appl. No.: 305,928

[22] Filed: Sep. 19, 1994

[30] Foreign Application Priority Data

Sep. 20, 1993 [JP] Japan .................... 5-233504

[51] Int. Cl.$^6$ .............................................. B23Q 3/157
[52] U.S. Cl. ............................................ 483/57; 483/55
[58] Field of Search ................................ 483/54, 55, 56, 483/57, 53, 5, 901; 364/474.21; 211/1.51, 1.52

[56] References Cited

U.S. PATENT DOCUMENTS

| | | | |
|---|---|---|---|
| 3,973,863 | 8/1976 | Smith | 483/55 |
| 4,596,067 | 6/1986 | Raiteri | 483/5 |
| 4,715,108 | 12/1987 | Sugiyama et al. | 483/54 |
| 4,819,320 | 4/1989 | Cairns et al. | 483/55 X |
| 4,922,603 | 5/1990 | Kosmowski | 483/56 |
| 5,068,458 | 12/1991 | Kosmowski | 364/474.21 |
| 5,302,166 | 4/1994 | Marantette et al. | 483/53 |

FOREIGN PATENT DOCUMENTS

| | | | |
|---|---|---|---|
| 4112706 | 10/1991 | Germany | 483/57 |
| 44547 | 3/1986 | Japan | 483/55 |
| 3166031 | 7/1991 | Japan | 483/55 |
| 161233 | 7/1991 | Japan | 483/57 |

*Primary Examiner*—William Briggs
*Attorney, Agent, or Firm*—Young & Thompson

[57] ABSTRACT

A printed circuit board working machine includes a working table on which a printed circuit board substrate is positioned and fixed, a spindle which is disposed above the working table to be movable horizontally and vertically and to which a predetermined cutting tool is detachably mounted, a controlling unit for controlling the movement of the spindle in accordance with a predetermined cutting data and a data processing unit operatively connected to the controlling unit. The data processing unit includes a data input circuit into which a circuit pattern data is inputted, a contour data preparation circuit for preparing a contour data of a circuit pattern to be prepared from the circuit pattern data from the data input circuit, a hatching data preparation circuit for preparing a hatching data to carry out a hatching operation with a predetermined width in a predetermined direction for working a residual portion of a circuit pattern to be prepared in accordance with the contour data from the contour data preparation circuit, and a cut data preparation circuit for preparing a cut data by continuously connecting adjoining hatching data at end portions thereof in accordance with the hatching data from the hatching data preparation circuit and transmitting the this prepared cut data to the controlling unit.

5 Claims, 16 Drawing Sheets

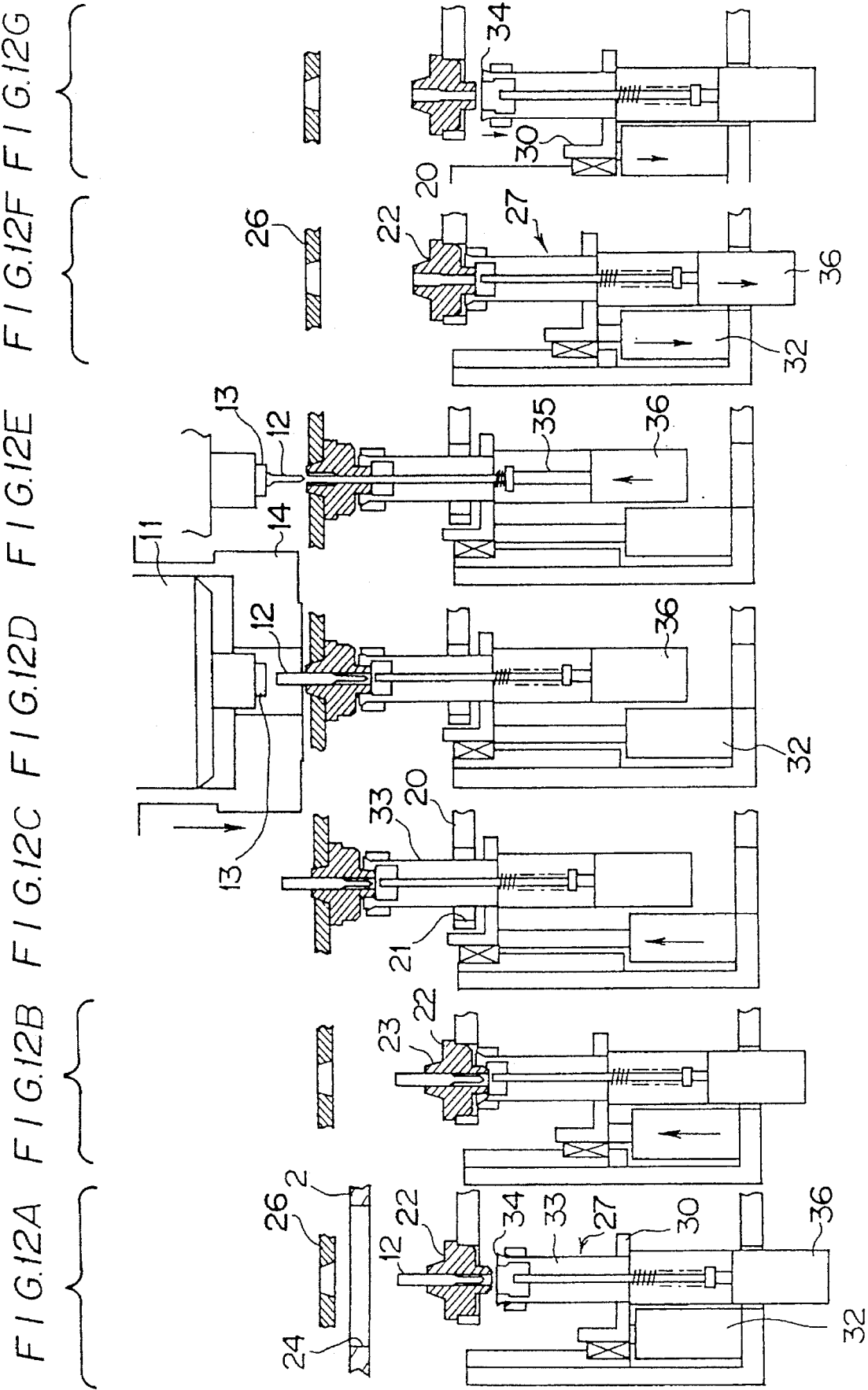

PRINTED CIRCUIT BOARD WORKING MACHINE

BACKGROUND OF THE INVENTION

1. Field of the Invention

The present invention relates to a printed circuit board (PCB) working machine, and more particularly to a PCB working machine for preparing a printed circuit board (PCB) by forming a circuit pattern on a copper foil substrate, for example, in accordance with data described by, for example, a computer aided design (CAD).

2. Description of the Related Art

It is required to experimentally produce the PCB, on which suitable electronic circuit is formed, precisely and speedily with low cost for the development of electronic equipments and the manufacturing of the electronic equipments which are not objects for mass-production.

However, when the PCB is experimentally produced, some optical processes and chemical processes are to be required, so that even in the preparation of less number of PCBs for testing, it is required to prepare a circuit pattern, which includes a complicated working, thus being inconvenient.

In order to overcome such inconvenience, there may be proposed a PCB working machine for cutting out a desired circuit pattern by effecting a cut-working to a copper foil substrate as a PCB material (called hereinafter PCB substrate). Such a PCB working machine is equipped with a working table for absorbing and securing the PCB substrate to carry out a desired cut-working, and above the working table, there is disposed a spindle which is movable under being controlled in X-axis and Y-axis directions by X-axis and Y-axis driving apparatuses and which is elevated vertically by a Z-axis driving apparatus. A desired cutting tool is detachably mounted to the spindle through a collet chuck. On the other hand, below the working table, there is disposed an index table for holding various cutting tools and exchanging the cutting tools in association with the lowering movement of the spindle. A float head formed with an air jetting port is also formed on an outer peripheral side of the spindle to be vertically movable in such a manner that the front end portion of the cutting tool fixedly clamped to the collet chuck projects from the float surface of the float head by a predetermined projection amount, the cutting tool sticks the PCB substrate by a predetermined depth, and an air layer is formed between the float surface of the float head and the PCB substrate by the air jetted from the air jetting port, whereby the sticking amount of the cutting tool is maintained constant and the gap between the float surface and the PCB substrate is also maintained.

In the PCB working machine of the structure described above, a cut width of the PCB is adjusted in such a manner that a desired PCB substrate is positioned on the working table and then absorbed and secured, the spindle is lowered by the Z-axis driving apparatus, and the projecting amount of the cutting tool is adjusted so as to accord with a desired sticking depth. Thereafter, the X-axis and Y-axis driving apparatuses are driven under the control thereof in accordance with the desired circuit pattern and then moved while rotating the spindle. In such a manner, the copper foil layer and an insulative substrate are cut to thereby form the desired circuit pattern.

During this circuit pattern forming operation, for example, after the cut-working in the X-axis direction of the PCB substrate, it is moved in the Y-axis direction by an amount corresponding to a cut amount, and a next cut-working again in the X-axis direction is performed. By repeating these workings, the cut-working to an entire surface of the PCB substrate can be done. In the cut-working in the X-axis direction, when the cutting tool is positioned to a position corresponding to a circuit pattern portion which is not required to be cut, the spindle is moved upward to a cutting position including no circuit pattern. Thereafter, the spindle is again lowered to continue the cut-working.

However, in the above mentioned PCB working machine, since it is necessary to move up and down the spindle in accordance with the circuit pattern of the PCB substrate, the spindle must be moved up and down very frequently, resulting in the positional shifting of the spindle during these up and down movements, and in an adverse case, a high precision working will not be expected, thus providing a significant problem. Furthermore, since the spindle and its associated members have relatively heavy weight, each elevational movement of the spindle requires much time which damages a speedy cut-working, thus also providing a problem.

Still furthermore, in a case where it is required to exchange a cutting tool held by the collet chuck of the spindle, the spindle is lowered to a portion near the index table, so that the exchanging of the cutting tool cannot be speedily carried out and, moreover, the large lowering amount, i.e. distance, of the spindle makes enlarged and complicated an elevating mechanism for the spindle, and thus, the spindle is made heavy, and when the spindle is moved fast at the working time thereof, it may be shifted and the cut-working at high speed with high precision will not be expected, thus also providing a problem.

Still furthermore, when the cutting working of the cutting tool advances, there may be caused a case in which the float surface of the float head takes a position riding on both a cut surface and a surface to be succeedingly cut. In such a case, a gap between the float surface of the float head and the cut surface is formed larger than a gap between the float surface and the surface to be succeedingly cut, resulting in that the air pressure from the air jetting port is made lower to the cut surface and, hence, there may be caused a case where the float surface is lowered or inclined. Because of this reason, it becomes difficult to ensure a constant gap between the float surface and the PCB substrate, and accordingly, it becomes impossible to constantly maintain the sticking amount of the cutting tool, and a precise cut-working with the constant width maintained cannot be expected, thus also providing a problem.

SUMMARY OF THE INVENTION

It is therefore an object of the present invention to provide a printed circuit board working machine capable of precisely and speedily forming circuit patterns of a printed circuit board.

This and other objects can be achieved according to the present invention by providing, in one aspect, a printed circuit board working machine comprising:

In another aspect of the present invention, there is provided a printed circuit board working machine comprising:

a board plate provided with an opening;

a working table which is disposed above the board plate and on which a printed circuit board substrate is positioned and fixed;

a spindle which is disposed above the working table to be movable horizontally and vertically and to which a predetermined cutting tool is detachably mounted;

a chuck mounted to the spindle so as to detachably hold a predetermined cutting tool to the spindle;

a drive means for driving the spindle horizontally and vertically;

a drive control means for controlling the movement of the spindle in accordance with a predetermined cutting data;

a tool store for holding a plurality of tool holders to which cutting tools are held, respectively, the tool store having a portion disposed below the location of the working table;

a tool store control means for positioning the tool store to a predetermined position;

a tool exchanging means for exchanging the predetermined cutting tool held by the chuck with a cutting tool held by said tool holder at a portion corresponding to the opening of the board plate; and a tool holder elevating mechanism for elevating a predetermined tool holder to a predetermined position at the cutting tool exchanging time.

In preferred embodiments, the tool store is an index table provided with a plurality of through holes for detachably holding the tool holders, and the tool holder elevating mechanism comprises an elevating member disposed to be movable up and down, the elevating member having a driver for driving the elevating member, a guide secured to a position corresponding to the tool holder holding hole at the cutting tool exchanging position and extending from the elevating member to a position in the vicinity of a lower surface of the index table, a push member secured to one end of the guide to push upward the tool holder, and a push bar guided by the guide to be movable up and down.

A tool mounting mechanism may be further disposed below the opening of the board plate, the tool mounting mechanism being provided with a support member. A guide rail extending in an elevational direction may be disposed on the support member and the elevating member may be disposed to the guide rail with a slider. The tool mounting mechanism may be composed of a support neck formed to the tool holder to be held by the through hole of the index table and an engaging member disposed movably to the elevating member and formed with an engaging member to be engaged with the support neck.

The tool mounting mechanism may be formed of a grip for gripping the tool holder and a driver for driving the grip to open and close the same.

The nature and further features of the present invention will be made more clear from the following descriptions made with reference to the accompanying drawings.

BRIEF DESCRIPTION OF THE DRAWINGS

In the accompanying drawings:

FIGS. 12A to 12G are views for the explanatory of the tool exchanging operation according to the present invention;

DESCRIPTION OF THE PREFERRED EMBODIMENTS

Figure 1:
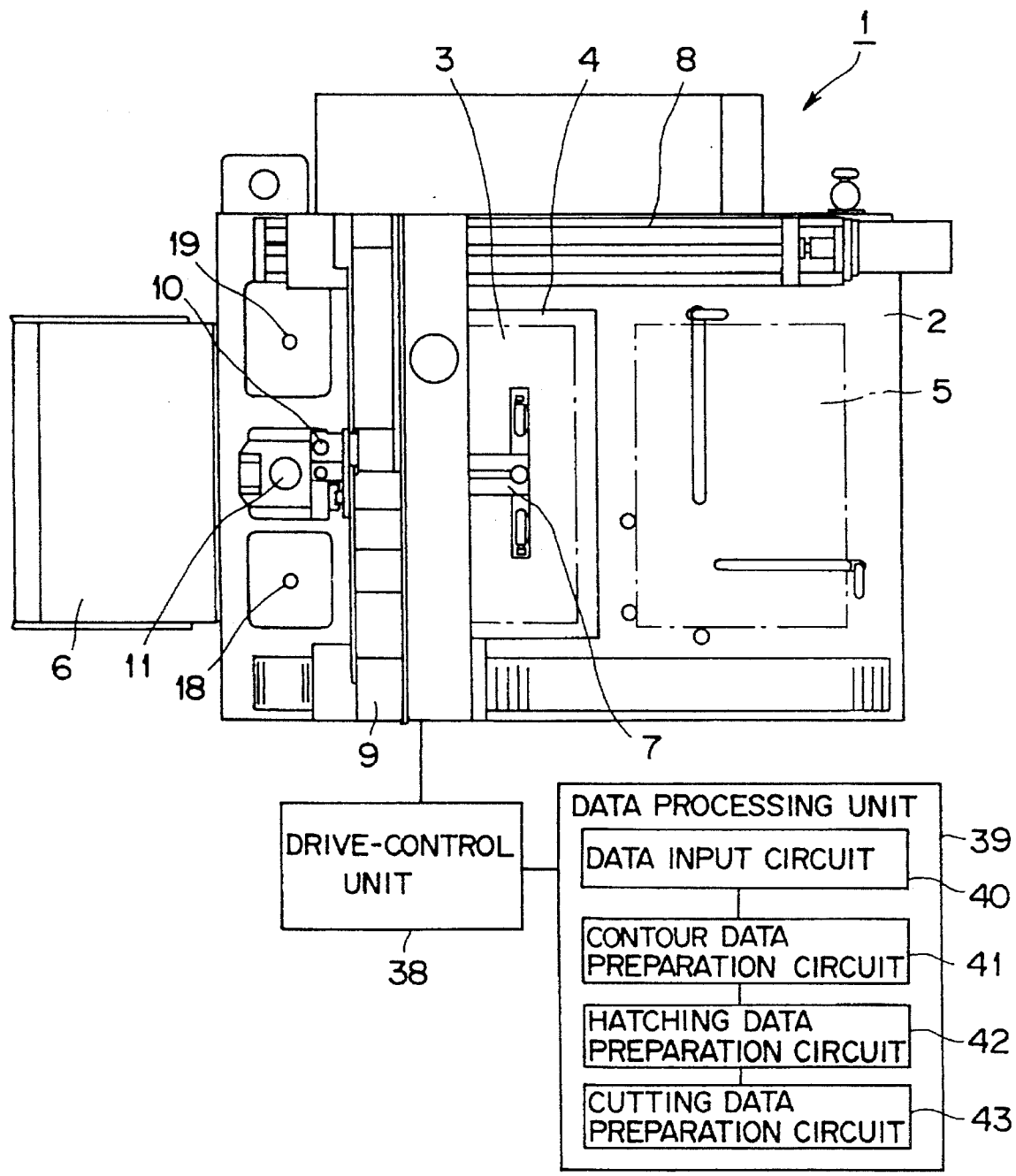
FIG. 1 is a plan view of a printed circuit board (PCB) working machine provided with a tool mounting mechanism according to the present invention.

Preferred embodiments of the present invention will be described hereunder with reference to FIGS. 1 to 26.

A first embodiment of a printed circuit board (PCB, called hereinlater) working machine will be first described with reference to FIGS. 1 to 5. A PCB working machine 1 is provided with an upper board 2 on which is disposed a working table 4 for absorbing and securing a PCB substrate 3 to a predetermined position. An unworked PCB set unit 5 for positioning an unworked PCB substrate 3 to be worked is disposed in the vicinity of the working table 4, on a left side as viewed in FIG. 1 with respect to the working table 4, and on the other opposing side, right side as viewed, a worked PCB substrate receiving unit 6 is disposed. Further, a PCB moving apparatus 7 is disposed above the working table 4 for moving the PCB substrate 3 between the unworked PCB substrate set unit 5 and the working table 4 and between the working table 4 and the worked PCB substrate receiving unit 6.

The PCB working machine 1 has an upper surface, on one side of which is disposed an X-axis driving apparatus 8 extending along one side of the PCB working machine 1, and above the PCB working machine 1, is arranged a Y-axis driving apparatus 9 extending in a direction normal to the X-axis driving apparatus 8 to be movable in a reciprocating manner in the X-axis direction by the X-axis driving apparatus 8. On the left side surface, as viewed in FIG. 1, of the Y-axis driving apparatus 9, is disposed a Z-axis driving apparatus 10 to be reciprocally movable in the Y-axis direction by the Y-axis driving apparatus 9. A spindle 11 is mounted to the Z-axis driving apparatus 10 to be movable, i.e. liftable, in a vertical direction.

Figure 2:
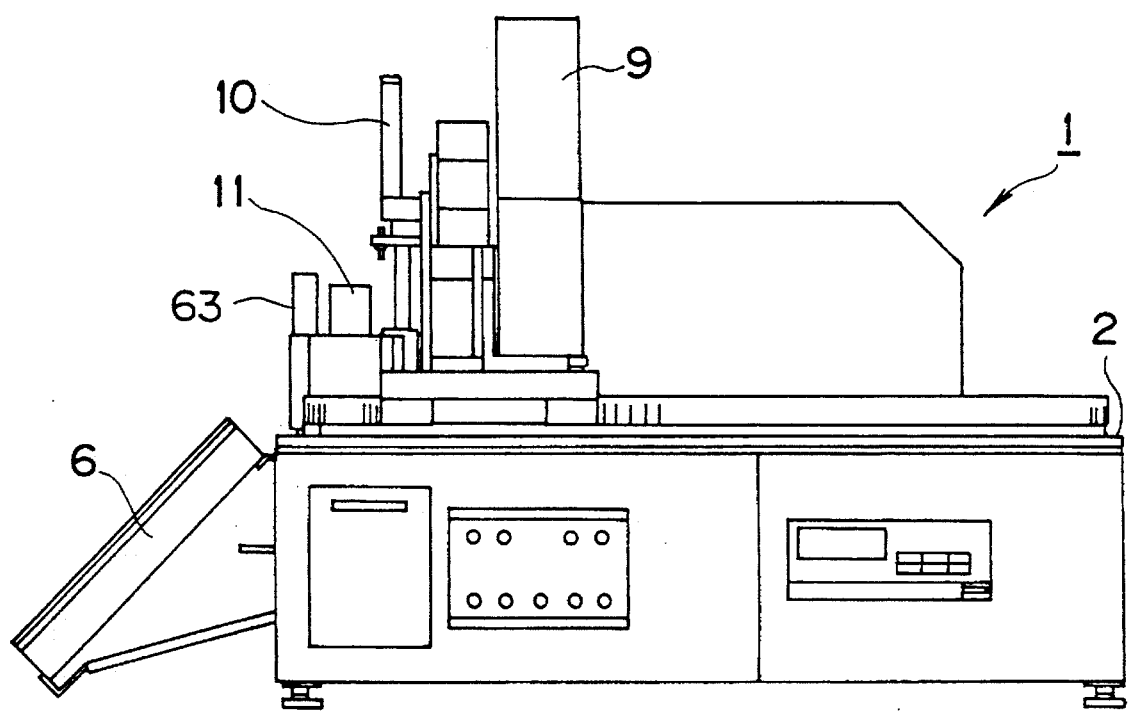
FIG. 2 is a front view of the PCB working machine of FIG. 1.
Figure 6:
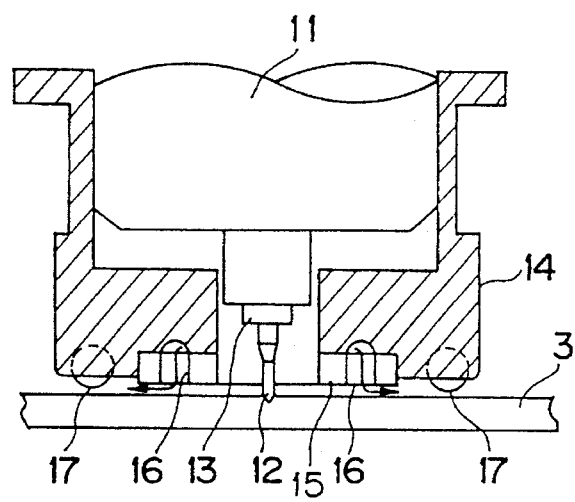
FIG. 6 is a front view of a float head of a spindle of the PCB working machine.

As shown in FIG. 6, the spindle 11 has a front end to which a collet chuck 13 for detachably holding and fixing a desired cutting tool 12 is mounted to be freely rotatable, and a float head 14 is disposed on an outer peripheral side of the spindle 11 so as to surround the collet chuck 13. The float head 14 is provided with a bottom surface as a float surface 15 from which a blade end of the cutting tool 12 projects, and the projecting amount thereof is made to be adjustable in its vertical position with respect to the spindle 11 by an operation of a stepping motor 63 (FIG. 2). That is, for example, the tip end of the cutting tool 12 is formed in a conical shape having an angle of 90° and the cutting width of the cutting tool 12 can be adjusted by the projecting amount of the tip end of the cutting tool 12 from the float surface 15 of the float head 14.

Figure 7:
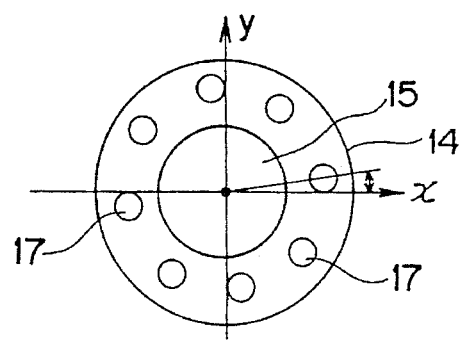
FIG. 7 is a bottom view of the float head of FIG. 6.

Further, as shown in FIGS. 6 and 7, in the surrounding of the cutting tool 12 mounted to the float head 14, an air layer is formed between the PCB substrate to be worked and the float surface 15 to thereby form an air jetting port 16 for jetting an air for adjusting a depth to be cut by the cutting tool 12, and in the present embodiment, a plurality of spacers, eight in the illustrated embodiment, 17, 17, . . . , 17 each having a protruded portion such as bearing in shape of spherical or curved surface are disposed to the outer peripheral portion of the float surface 15. Furthermore, since the float head 14, i.e. cutting tool 12, is moved, while performing the cutting operation, in the X- and Y-axis directions, the spacers 17 are formed to positions offset from the X- and Y-axis directions and from the circumferential direction from directions of 45° with respect to the respective axes so as not to engage with portions formed by the cutting working.

A linear gauge 18 is disposed, for measuring the positional heights of the float surface 15 and the front end of the cutting tool 12, between the working table 4 on the upper board 2 of the PCB working machine 1 and the worked PCB receiving unit 6, and a horizontal drawing chuck 19 for horizontally drawing cutting tool 12 after the cutting work from the collet chuck 13.

An index table 20, as a tool store, held rotatably by an index 64 is disposed below the upper board 2 of the PCB working machine 1, and the index table 20 is provided with an outer peripheral portion to which a plurality of engaging holes 21, 21, . . . , 21 are formed, which vertically penetrate the index table 20. A plurality of tool holders 22 supporting the various types of cutting tools 12 are detachably mounted to the engaging holes 21, respectively. Each tool holder 22 has an upper peripheral portion to which a tapered surface 23 reduced in diameter upwardly is formed. The upper board 2 is provided with an opening 24 to a position at which the collet chuck 13 of the spindle 11 mounted to the upper board 2 carries out the tool exchanging operation, and a positioning plate 26 formed with a tapered hole 25 with which the tapered surface 23 of the tool holder 23 is engaged is disposed above the opening 24 of the upper board 2.

Figure 3:
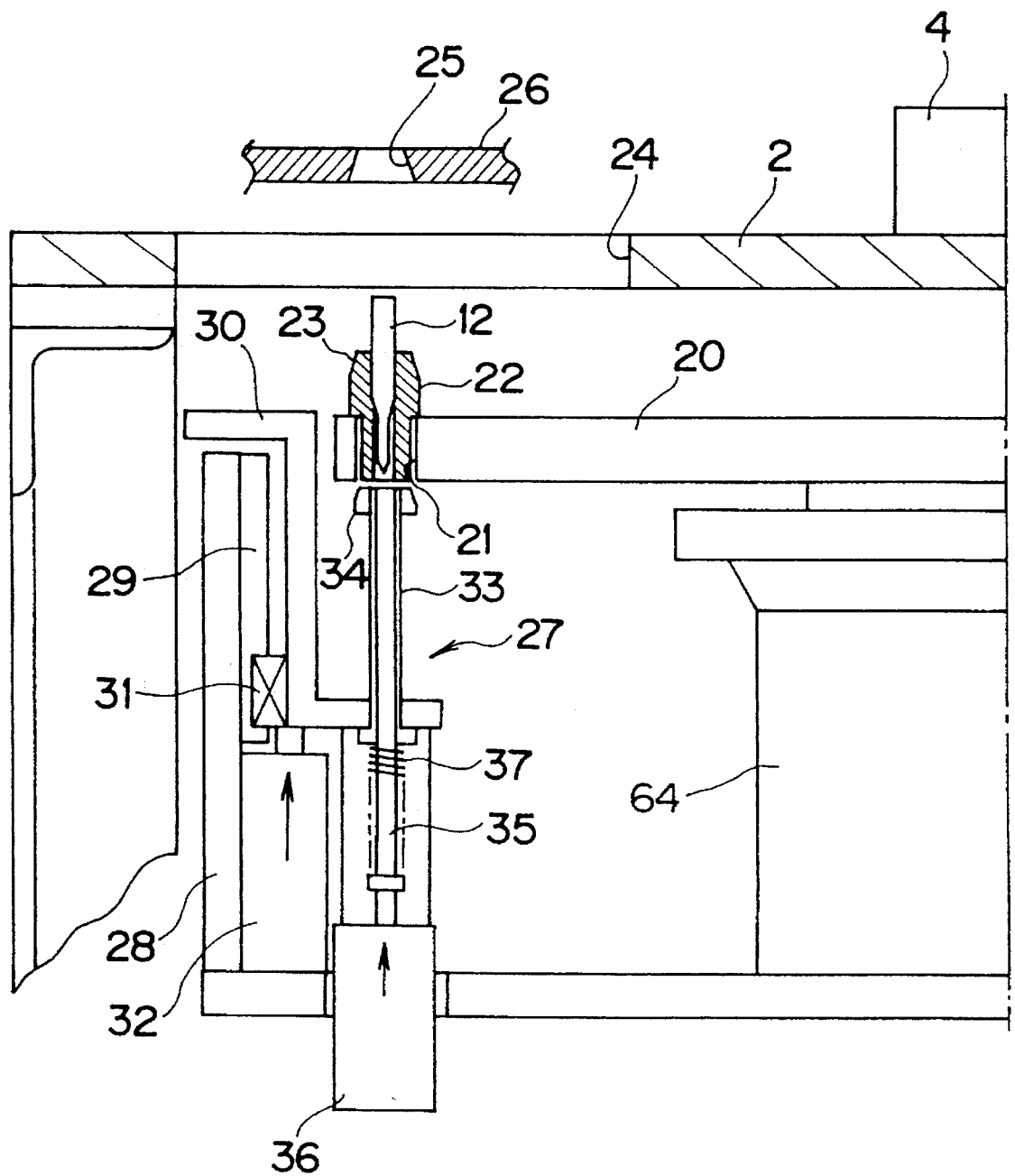
FIG. 3 is a front view of an index table provided for the PCB working machine of FIG. 1.
Figure 4:
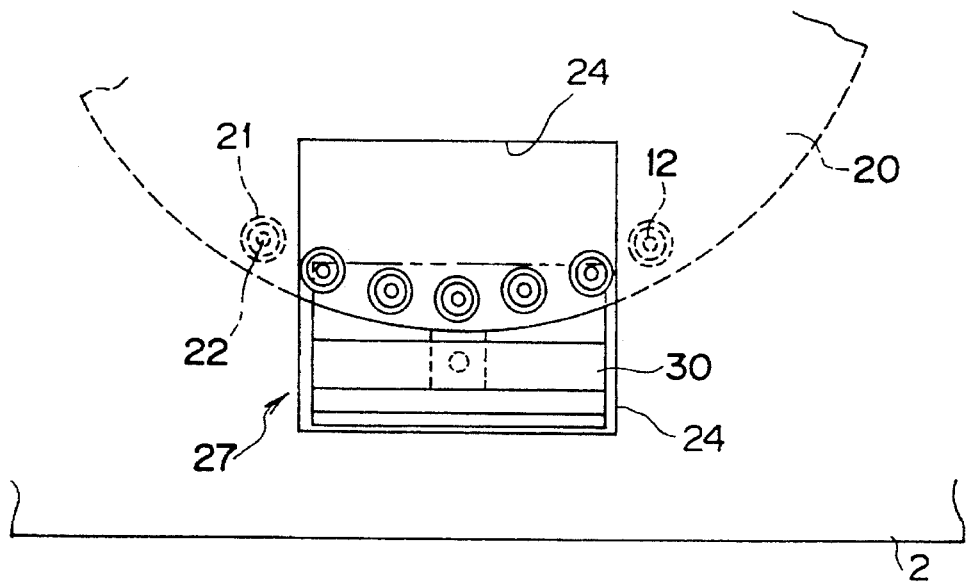
FIG. 4 is a plan view of FIG. 3.
Figure 5:
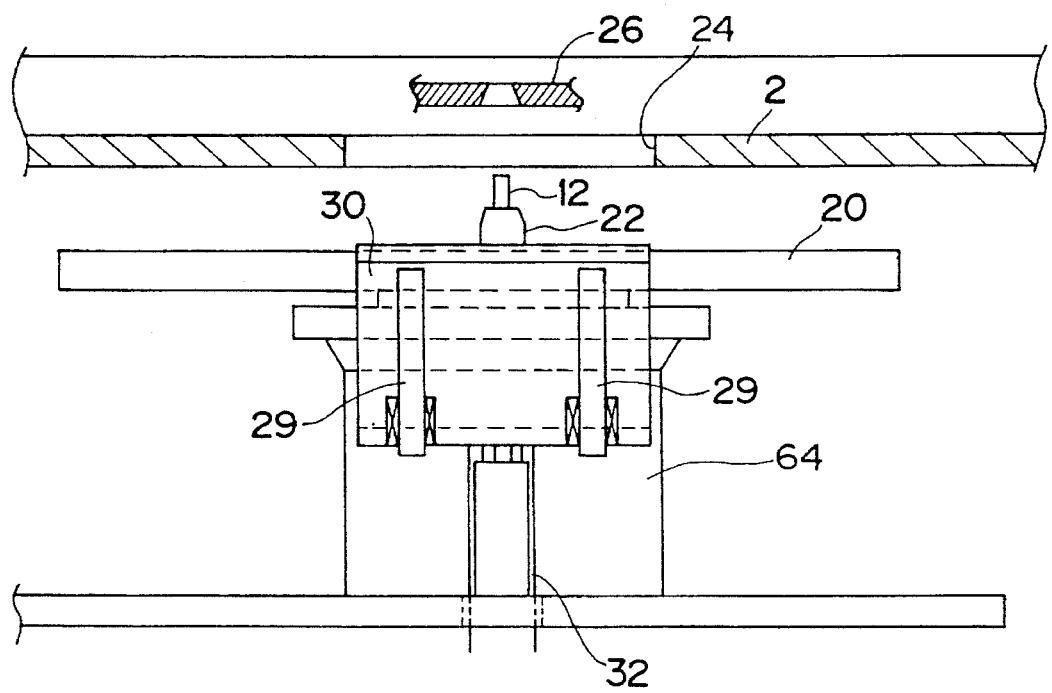
FIG. 5 is a side view of FIG. 3.

Furthermore, as shown in FIGS. 3 to 5, below the opening 24 is disposed a tool mounting mechanism 27 provided with a supporting member 28 for supporting a lifting motion of the tool. A guide rail 29 is disposed above the supporting member 28 and on the side of the index table 20 so as to extend vertically in an installed state, and an elevating member 30 in shape of a crank is mounted to the guide rail 29 to be liftable through a slider 31 along the guide rail 29. A guide pipe 33 is secured in the elevating member 30 so as to penetrate the same, the guide pipe 33 being arranged at a position corresponding to the engaging hole 21 at the cutting tool exchanging position so that the front end of the guide pipe 33 extends to a portion near the lower surface of the index table 20. A push member 34 abutting against the lower surface of the tool holder 22 is attached to the upper end portion of the guide pipe 33. A push bar 35 having an outer diameter smaller than an inner diameter of cutting tool supporting hole of the tool holder 22 is inserted into the guide pipe 33 to be movable in the vertical direction therein. Furthermore, a push cylinder 36 for elevating the push bar 35 is mounted to the lower surface side of the elevating member 30, and a spring 37 for urging downward the push bar 35 is also disposed to the outer peripheral side of the push bar 35 on the lower surface side of the elevating member 30.

Further, as shown in FIG. 1, the PCB working machine according to the present embodiment is equipped with a controller 38 for controlling the operation of the drive system including the X-axis driving apparatus 8, the Y-axis driving apparatus 9, the Z-axis driving apparatus 10, the PCB moving apparatus 7 and the step motor 63. A data processing apparatus 39 for transmitting a predetermined working data to the controller 38 is connected thereto, and the data processing apparatus 39 is provided with a data input circuit 40, contour data preparation circuit 41, a hatching data preparation circuit 42 and a cut data preparation circuit 43, respectively. To the data input circuit 40 is inputted a circuit pattern data described on the basis of a computer aided design (CAD), and the contour data preparation circuit 41 is a circuit for forming a contour data of a circuit pattern to be formed by the circuit pattern data from the data input circuit 40. The hatching data preparation circuit 42 is a circuit for preparing a hatching data for the hatching with a predetermined width in a predetermined direction for working a residual portion of the circuit pattern to be formed in accordance with the contour data from the contour data preparation circuit 41. The cut data preparation circuit 43 is a circuit for forming a possibly continuous cut data by sequentially connecting adjacent hatching date at their end portions in accordance with the hatching data from the hatching data preparation circuit 42.

Figure 8:
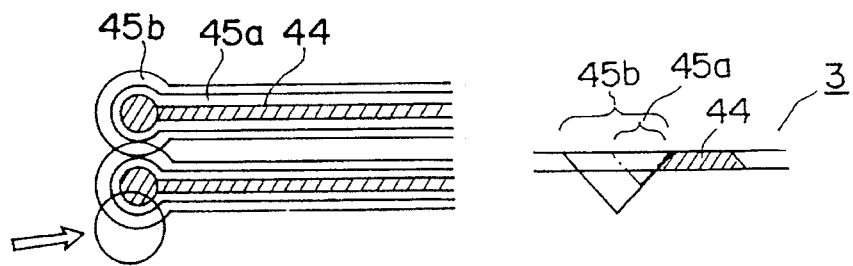
FIG. 8 is a view for the explanatory of a preparation of a contour data from a circuit pattern data according to the present invention.

That is, the pattern data described on the basis of the CAD is read in by the data input circuit 40, and a contour data 45a with a fine width is prepared by the contour data preparation circuit 41, as shown in FIG. 8, in accordance with the circuit pattern data 44 outputted from the data input circuit 40 and, then, a contour data 45b with a wide width is prepared. The reason why such fine and wide contour data 45a and 45b are independently prepared is for making clean the finish contour cut surface by first performing the fine width cutting and for performing the fine contour cut working. Although the wide width cutting is for speedily cutting an wide area, the preparation of the fine width contour data 45a may be deleted in a certain case.

Figure 9:
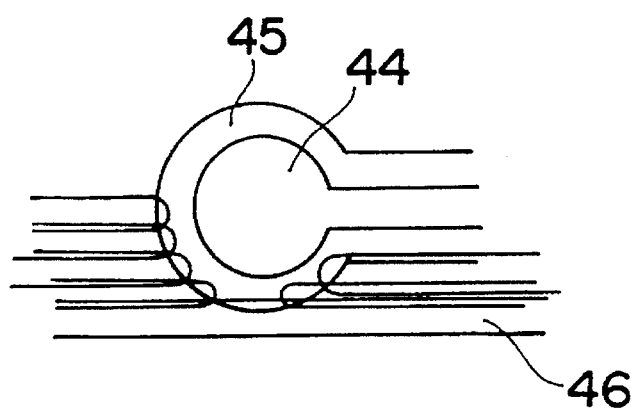
FIG. 9 is a view for the explanatory of a preparation of a hatching pattern data according to the present invention.
Figure 10:
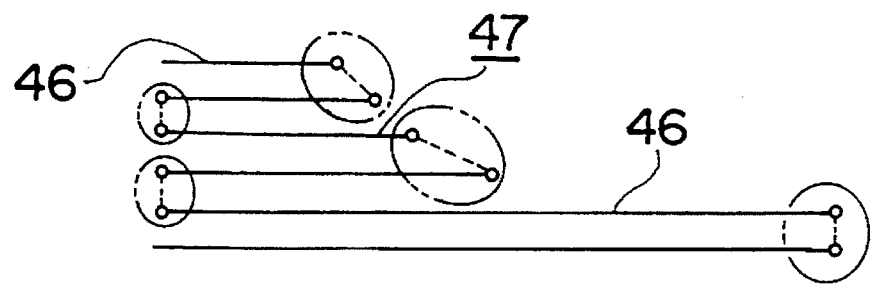
FIG. 10 is a view for the explanatory of a preparation of a cutting data according to the present invention.

Next, as shown in FIG. 9, the hatching pattern data 46 of all the residual portion of the circuit pattern is prepared by the hatching data preparation circuit 42 by carrying out the pattern hatching of the residual portion of the circuit pattern to be formed in accordance with the contour data 45 from the contour data preparation circuit 41 operation in the designated direction, for example, the X-axis direction, in consideration of the overlapping thereof. This overlapping may be set to an optional value by, for example, inputting the same from the data input circuit 40 with % unit. Then, as shown in FIG. 10, the possibly continuous cut data 47 is prepared by connecting the nearest points at end point coordinate values of the hatching pattern by the cut data preparation circuit 43 in accordance with the hatching pattern data 46 prepared by the hatching date preparation circuit 42, thereby preparing the possibly continuous single stroke cut data 47.

Figure 11A:
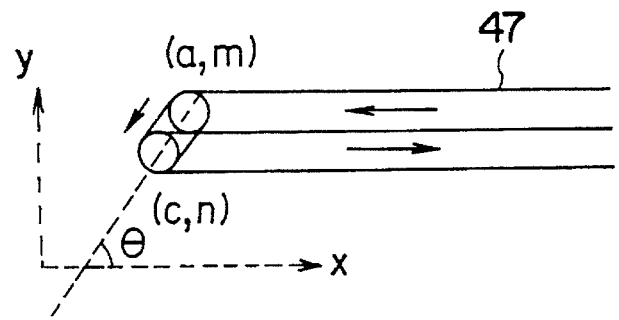
FIGS. 11A, 11B and 11C are views showing the sequence for the preparation of the cutting data by connecting the hatching pattern data according to the present invention.
Figure 11B:
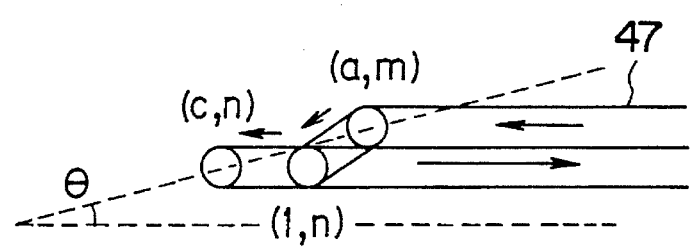
Figure 11C:
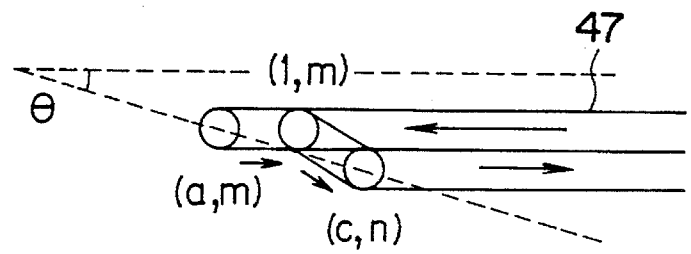

The preparation of the cut data 46 is described in detail hereunder with reference to FIG. 11. First, referring to FIG. 11A, when end points (a, m) and (c, n) of two hatching patterns are connected and in a case where the connecting line has an inclination of θ of more than 30° with respect to the pattern hatching direction (x-axis in the illustration), the end points are connected as they are, but in a case of |c−a|< w×cot 30° (w: hatching width=|m−n|), it is necessary to set an intermediate point (1, n) so as not to cut out a necessary portion and to connect the intermediate point (1, n) and the point (a, m). In FIG. 11B, 1=w×cot 30° and in FIG. 11C, 1=w×cot 30°.

FIG. 12 shows a case of modification of the push member 34 in FIG. 3 so that the front end of the push member 34 corresponds in shape to the tool holder.

Figure 13:
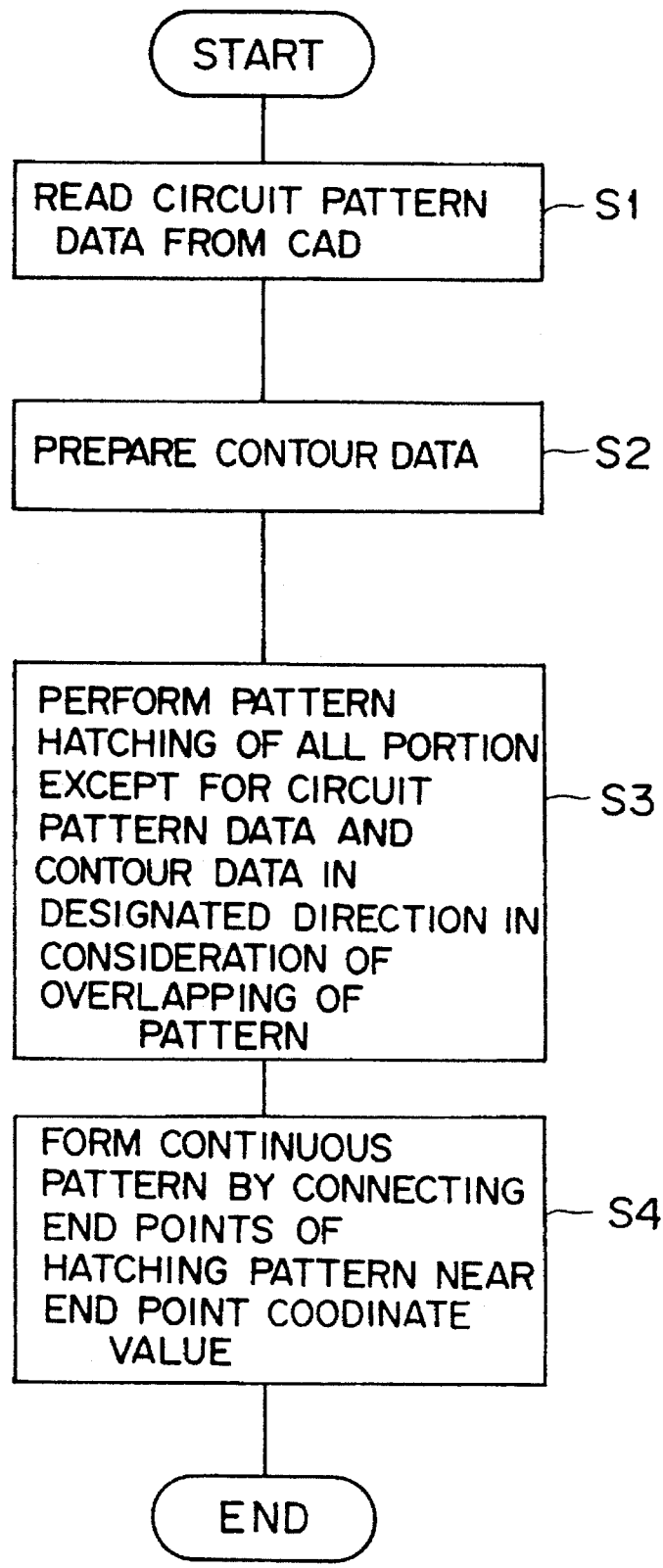
FIG. 13 is a flowchart for the preparation of the cutting data for the cut-working according to the present invention.

The operation of the PCB working machine 1 of the described embodiment will be described hereunder with reference to FIGS. 12 to 14.

When a desired cutting tool 12 is mounted to the collet chuck 13 of the spindle 11, the spindle 11 is moved above the opening 24 of the upper board 2 and the index table 20 is rotated. Then, the tool holder 22 holding the desired cutting tool 12 is positioned above the guide pipe 33 of the elevating member 30, and under this condition, a drive cylinder 32 is driven to raise the elevating member 30 upward from the initial position shown in FIG. 12A to the position shown in FIG. 12B to thereby raise the guide pipe 33 and the push member 34. As shown in FIG. 12C, the push member 34 holds the tool holder 22 and pushes it upward through the engaging hole 21 of the index table 20 so that the tapered surface 23 of the tool holder 22 is engaged with the tapered hole 25 of the positioning plate 26. The tool holder 22 is provided with a flanged surface facing the positioning plate 26, the flanged surface acting as a member for limiting the lifted height and the perpendicularity of the tool holder 22 by abutting against the positioning plate 26, and on the other hand, the tapered surface 23 of the tool holder 22 acts as an insertion and centering member to the positioning plate 26.

Thereafter, as shown in FIG. 12D, the spindle 11 is lowered by a predetermined amount by the operation of the Z-axis driving apparatus 10, and under this condition, as shown in FIG. 12E, the push bar 35 is raised by the operation of the push cylinder 36 against an urging force of the spring 37 to thereby move upward the cutting tool 12 held by the tool holder 22 and to fixedly clamp it to the collet chuck 13 of the spindle 11.

In the next step shown in FIG. 12F, the spindle 11 is moved upward and the push bar 35 and the elevating member 30 are lowered by returning the push cylinder 36 and the drive cylinder 32 to engage and hold the empty tool holder 22 to the engaging hole 21. Then, as shown in FIG. 12G, the chuck of the push member 34 is released to lower the elevating member 30 to return it to the original starting position.

In the above operation, according to the present embodiment, since the cutting tool 12 is raised upward above the upper plate 2 by the operation of the tool mounting mechanism 27, the cutting tool 12 can be speedily exchanged with another one without lowering the spindle 11 at a position below the upper board 2.

The cut working operation of the PCB substrate 3 of the present invention will be described hereunder with reference to the flowchart of FIG. 13.

When it is required to prepare a desired circuit pattern to the PCB substrate 3, a predetermined PCB substrate 3 to be worked is positioned to the unworked PCB set unit 5.

Under the condition, the circuit pattern data 44 is read on the basis of the CAD by the data input circuit 40 (step S1) and a predetermined contour data 45 is then prepared by the contour data preparation circuit 41 (step S2). Next, the hatching pattern data 46 of all the residual portion of the circuit pattern to be formed in accordance with the contour data 45 from the contour data preparation circuit 41 is prepared (step S3), and thereafter, the possibly continuous single stroke cutting date 47 is prepared by the cut data preparation circuit 43 (step S4).

In the subsequent step, the PCB substrate 3 arranged to the unworked PCB set unit 5 is moved to the upper surface of the working table 4 by the operation of the PCB moving apparatus 7 and is then secured thereto. Under the condition, the cutting date 47 prepared by the data processing unit 39 is outputted to the controller 38 by which the desired drive control is performed.

That is, in detail, the spindle 11 is rotated and lowered by the Z-axis driving apparatus 10 to thereby stick the front end of the cutting tool 12 to a predetermined depth of the surface of the PCB substrate 3, and according to the sticked depth of the cutting tool 12, a width to be cut is determined. The sticked amount of the cutting tool 12 is measured by measuring the lower surface of the float surface 15 and the front end of the cutting tool 12 by means of the linear gauge 18 and adjusted by measuring the difference between the lower surface and the front end.

Figure 14A:
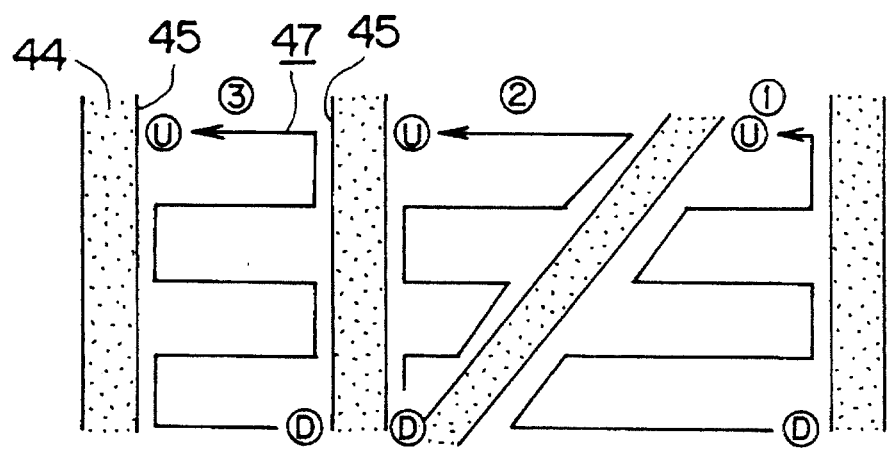
FIGS. 14A and 14B are views for the explanatory for the cut-working operations according to the present invention and a conventional technique, respectively.
Figure 14B:
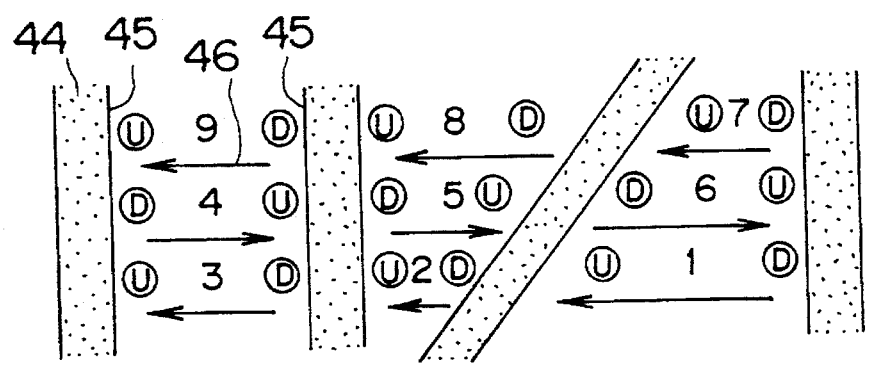

Then, the X-axis driving apparatus 8 and the Y-axis driving apparatus 9 are driven in accordance with the continuous cutting data 47 by the operation of the controller 38, and as shown in FIG. 14A, the PCB substrate 3 is subjected to the cut working operation by the cutting tool 12 of the spindle 12 while jetting the air from the air jetting port 16. In FIG. 14A, reference character D represents the lowering of the spindle and reference character U represents the raising thereof.

Furthermore, according to the present embodiment, since the spacers 17 are provided for the lower surface of the float head 14 of the spindle 11, the lowering or inclining of the float surface 15 can be limited by the contact of the spacers 17 to the surface of the PCB substrate 3, thus ensuring the constant gap between the float surface 15 and the PCB substrate 3. Moreover, the projected ends of the spacers 17 are formed in spherical shapes, abutting resistance can be extremely reduced even if the spacers 17 abut against the PCB substrate 3, resulting in the insurance of the smooth motion of the float head 14, and the air flow from the air jetting port 16 never is disturbed.

Thereafter, hole making working and outer shape forming working are performed, and the worked PCB substrate 3 is moved to the worked PCB receiving unit 6 by the PCB moving apparatus 7, thus finishing a series of the predetermined workings.

As described above, according to the present embodiment, since the cut-working to the hatching portion is performed in accordance with the possibly continuous single stroke cutting data, the elevating motion of the spindle can be remarkably reduced in frequencies, thereby preventing the positional shifting thereof during the elevating motion from causing, thus performing the cut-working with high performance. Furthermore, the cut-working can be also speedily carried out by reducing the elevating motion of the spindle 11 at the tool exchanging time.

Since the cutting tool 12 is raised above the upper board 2 by the operation of the tool mounting mechanism 27, it is not necessary to lower the spindle 11 to a position below the upper board 2, so that the tool exchanging operation can be speedily performed. Furthermore, since the elevating motion of the spindle 11 is made small in amount, the structure of the elevating mechanism can be made simple, making simple and clear the surrounding of the spindle 11 as well as reducing the weight of the spindle 11. As a result, the moving speed of the spindle 11 can be made fast with the high cutting accuracy being maintained.

Still furthermore, since the spacers 17 are formed to the lower surface of the float head 14, the lowering or inclining of the float surface 15 can be prevented in contact of the spacers 17 to the surface of the PCB substrate 3, ensuring the constant gap between the float surface 15 and the PCB substrate 3. As a result, the sticking amount of the cutting tool 12 can be maintained constant, thus enabling the fine cut-working with the constant width.

Figure 15:
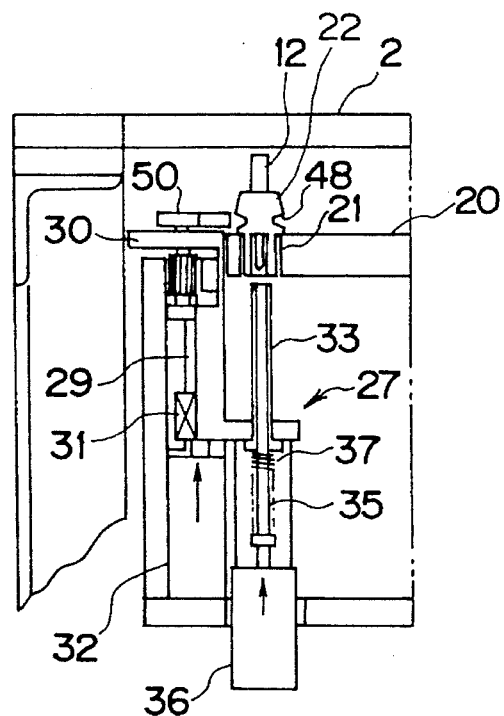
FIG. 15 is a front view showing the tool mounting mechanism according to another embodiment of the present invention.
Figure 16:
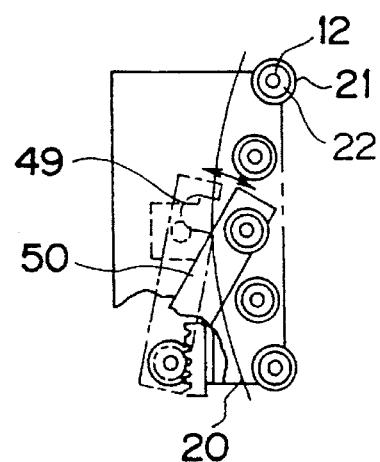
FIG. 16 is a plan view of FIG. 15.
Figure 17:
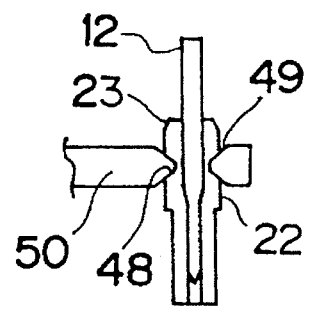
FIG. 17 is a front view showing an engaging condition between a tool holder and an engaging plate of the tool mounting mechanism of FIG. 15.

FIGS. 15 to 17 represent another embodiment of the tool mounting mechanism 27 to be applied to the PCB working machine 1 according to the present invention, in which an engaging groove 48 as a support neck is formed to an upper outer peripheral surface of the tool holder 22 to be held by the engaging hole 21 of the index table 20, and an engaging plate 50 formed, at its one side edge, with a U-shaped engaging recess 49 to be engaged with the engaging groove 48 of the tool holder 22 is provided to be rotatable to the upper surface of the elevating member 30.

In this embodiment, the push member 34 in the former embodiment is not disposed, and the other structure is substantially the same as that of the former embodiment, so that like reference numerals are added to portions or members corresponding to those of the former embodiment.

In this embodiment, when it is required to mount a desired cutting tool 12 to the collet chuck 13 of the spindle 11, the spindle 11 is moved to a portion above the opening 24 of the upper board 2 and the index table 20 is rotated to move the tool holder 20 holding the desired cutting tool 12 to a position above the guide pipe 33 of the elevating member 30. Under the condition, the engaging plate 50 is first rotated so as to engage the engaging recess 49 of the plate 50 with the engaging groove 48 of the tool holder 22. Then, the elevating member 30 is raised by the operation of the drive cylinder 32 to move upward the tool holder 22 from the engaging hole 21 of the index table 20.

Under the condition that the spindle 11 is lowered by a predetermined amount by the operation of the X-axis driving apparatus, the push bar 35 is moved upward against the urging force of the spring 37 and fixedly clamped by the collet chuck 13 of the spindle. Then, the spindle is moved upward and the push cylinder 36 and the drive cylinder 32 are returned to lower the push bar 35 and the elevating member 30 to thereby hold the empty tool holder 22 to the engaging hole 21 of the index table 20. At the same time, the engaging plate 50 is rotated to release the engagement between the engaging recess 49 of the plate 50 and the engaging groove 48 of the tool holder 22.

Accordingly, in this embodiment, the cutting tool 12 can be also moved to a position above the upper board 2 by the tool mounting mechanism 27 of this embodiment, so that substantially the same advantageous effects as those mentioned with respect to the former embodiment can be attained.

Figure 18A:
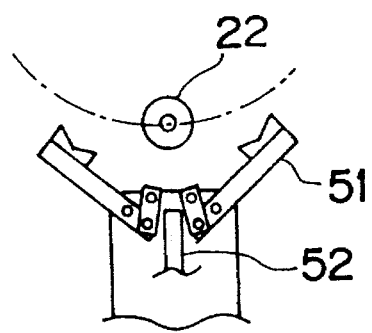
FIGS. 18A and 18B are plan views showing another example of a tool holder supporting mechanism.
Figure 18B:
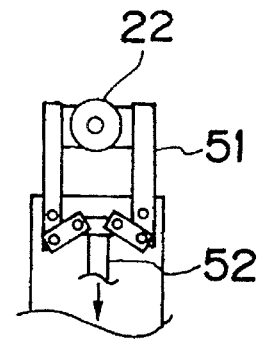

In a preferred modification, as shown in FIG. 18, in place of the engaging plate 50 of the above embodiment, an arrangement may be adapted in which a pair of gripping arms 51 of link structure are disposed and the tool holder 22 is held by opening and closing the gripping arms 51 by means of a gripping cylinder 52.

Figure 19A:
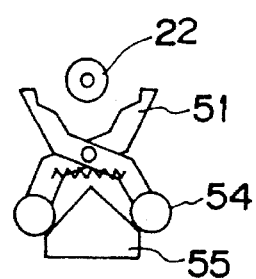
FIGS. 19A and 19B are plan views also showing a further example of a tool holder supporting mechanism.
Figure 19B:
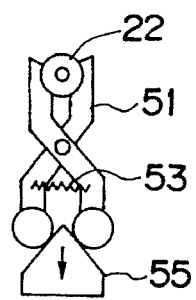

Furthermore, as shown in FIG. 19, another arrangement may be adapted in which a pair of gripping arms 51 urged in a closing direction by a spring 53 is disposed in cross shape, cam followers 54 are secured to base end portions of the respective arms 51 and a reciprocating cam 55 is also disposed between these cam followers 54 to be reciprocally movable to thereby carry out the opening/closing operation of the gripping arms 51.

Figure 20A:
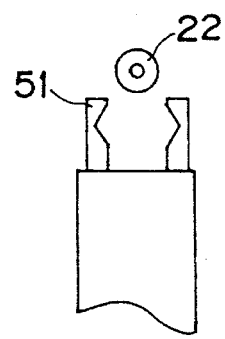
FIGS. 20A, 20B and 20C are plan views also showing a still further example of a tool holder supporting mechanism.
Figure 20B:
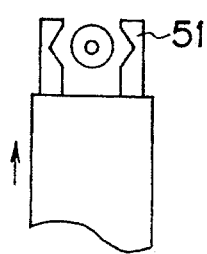
Figure 20C:
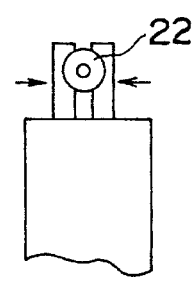

In a further modified arrangement, as shown in FIG. 20, the opening/closing operation may be performed by parallelly moving a pair of gripping arms 51.

Figure 21:
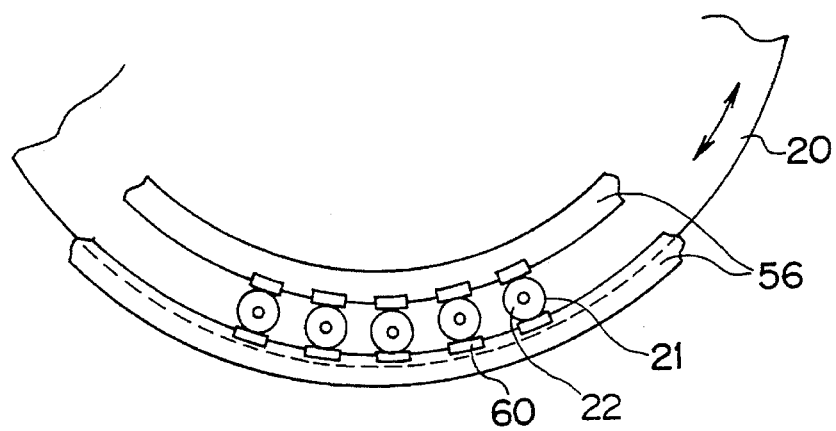
FIG. 21 is a plan view showing the tool mounting mechanism according to a further embodiment of the present invention.
Figure 22:
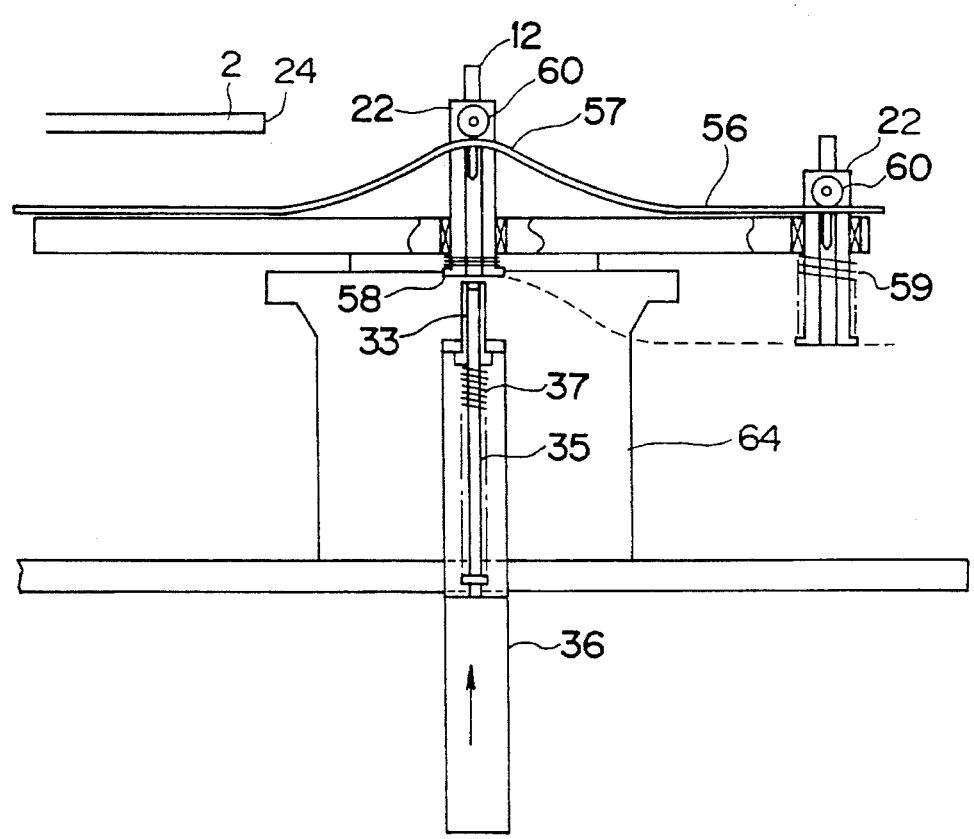
FIG. 22 is a front view of FIG. 21.

FIGS. 21 and 22 represent a further embodiment of the tool mounting mechanism 27, in which a pair of support rails 56 are disposed to the inner and outer sides of the engaging holes 21 formed at the outer peripheral portion of the index table 20, and the support rails 56 have upwardly, as viewed, protruded portions 57 at portions corresponding to the tool exchanging position for the cutting tool 12. Rollers 60 are supported by the upper both sides of the tool holders 22, respectively, at the upper surface sides of the support rails 56 to be rotatable along the rails 56. The protruded portions 57 may be formed with recessed portions into which peripheries of rollers 60 are shallowly fitted for surely positioning the tool holders 22. The tool holders 22 are fitted to be slidable in a vertical direction into the respective engaging holes 21 of the index table 20. To the lower end portion of each of the tool holders 22 is formed flanged portion 58 projecting at the outer peripheral portion thereof, and a spring 59 urging downward the tool holder 22 is disposed between the flanged portion 58 and the lower surface side of the engaging hole 21.

A guide pipe 33 is disposed at a portion below the index table 20 and corresponding to the engaging hole 21 at which the cutting tool 12 is exchanged, and the front end of the guide pipe 33 extends in the vicinity of the lower surface of the tool holder 22, and the push bar 35 is fitted into the guide pipe 33 to be movable in its axial direction. A push cylinder 36 for moving the push bar 35 is mounted to a lower portion of the push bar 35, and a spring 37 for downwardly urging the push bar 35 is disposed to the outer peripheral side of the push bar 35.

According to this embodiment, when the index table 20 is rotated, the rollers 60 of the tool holders 22 are rolled along the support rails 56, and when a predetermined tool holder 22 is moved to the protruded portions 57 of the rails 56, that tool holder 22 is raised upward against the urging force of the spring 59 to the upper most position of the protruded portions 57 of the support rails 56. In the meantime, under the lowered condition of the spindle 11 by a predetermined amount by the operation of the Z-axis driving apparatus 10, the cutting tool 12 held by the tool holder 22 is moved upward by raising the push bar 35 against the urging force of the spring 37 by the operation of the push cylinder 36, and the cutting tool 12 is then clamped by the collet chuck 13 of the spindle 11.

Accordingly, according to the present embodiment, substantially the same advantageous effects as those of the former embodiments can be attained because it is not necessary to move down the spindle 11 to a position below the upper board 2.

Figure 23:
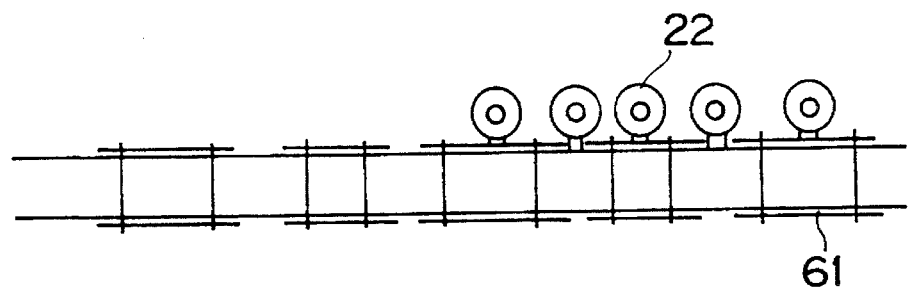
FIG. 23 is a plan view showing the tool mounting mechanism according to a still further embodiment of the present invention.
Figure 24:
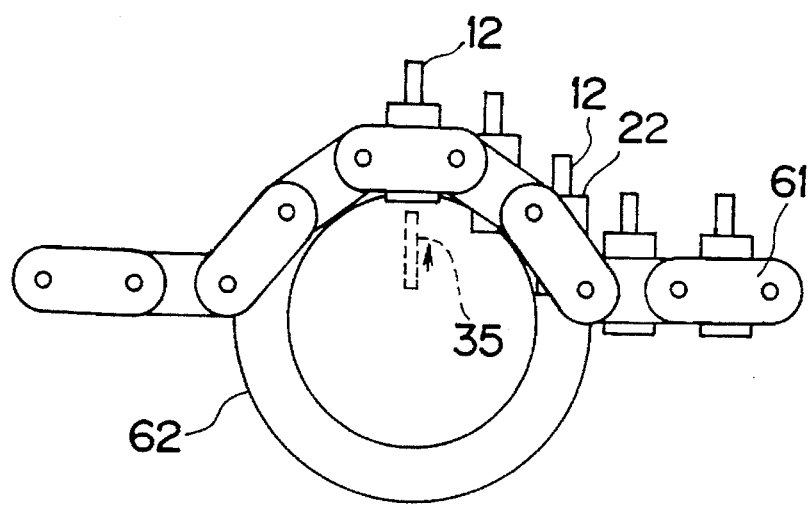
FIG. 24 is a front view of FIG. 23.

FIGS. 23 and 24 represent a further embodiment of the tool mounting mechanism 27 adapted to the PCB working machine of the present invention.

In this embodiment, an index chain 61 is utilized in place of the index table in the former embodiments, and a sprocket 62 for driving the index chain 61 is disposed to be rotatable at a place corresponding to the cutting tool exchanging position. A tool holder 22 for supporting the cutting tool 12 is secured to be swingable on one side of the index chain 61, and the tool holder 22 is maintained its perpendicular attitude by the self gravity. A push bar 35 is also disposed on one side of the sprocket 62 for pushing upward the cutting tool 12 held by the tool holder 22 positioned at the uppermost position of the sprocket 62.

According to this embodiment, the index chain 61 is driven by the rotation of the sprocket 62 to move the desired cutting tool 12 to the uppermost position of the sprocket 62, and under this state, the push bar 35 is raised upward to push upward the cutting tool 12 to thereby clamp the same to the collet chuck of the spindle.

As described above, according to this embodiment, it is also not necessary to move down the spindle to a position below the upper board 2, so that the substantially the same advantageous effects as those described with reference to the former embodiments can be attained.

Figure 25:
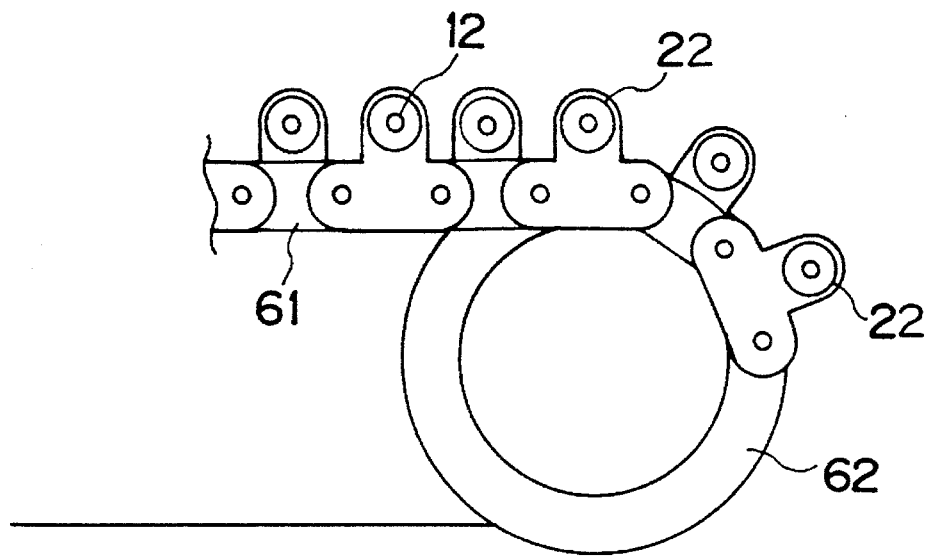
FIG. 25 is a plan view showing the tool mounting mechanism according to a still further embodiment of the present invention.
Figure 26:
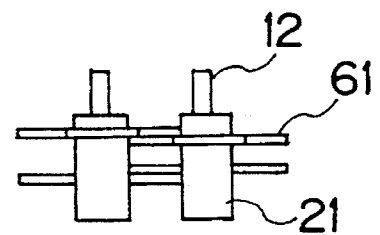
FIG. 26 is a front view of FIG. 25.

FIGS. 25 and 26 represent a still further embodiment of the tool mounting mechanism 27 adapted to the PCB working machine of the present invention.

In this embodiment, an index chain 61 is also utilized in place of the index table in the former embodiments, and a sprocket 62 for driving the index chain 61 is disposed to be rotatable circumferentially. A tool holder 22 for supporting a cutting tool 12 on one side of the index chain 61.

According to this embodiment, the index chain 61 is driven by the rotation of the sprocket 62 to move the desired cutting tool 12 to a desired tool exchanging position, and under this state, the cutting tool 12 held by the tool holder 22 is pushed upward to thereby clamp the same to the collet chuck of the spindle.

As described above, according to this embodiment, it is also not necessary to move down the spindle to a position below the upper board 2, so that the substantially the same advantageous effects as those described with reference to the former embodiments can be attained.

It is to be noted that, although in the foregoing descriptions relating to the various embodiments, only the mounting order of the cutting tool is described, the dismounting thereof will be performed in order reverse to that described hereinbefore. However, in the dismounting operation, there may cause a case where the collet chuck 12 chamfers the cutting tool 12, so that it will be necessary to move up and down the cylinder 11 to lower the cutting tool 12 by clamping the cutting tool 12 with the parallel drawing chuck 19.

According to all the embodiments of the present invention, only the tool holder for being subjected to the tool exchanging operation approaches to the float head in the tool exchanging operation even if the front end of the head portion including the float head has a diameter larger than that of the tool holder, so that the distance between the adjoining tool holders can be made smaller than a radius of the front end of the head portion, thus improving the tool accommodating efficiency.

According to the preferred embodiments of the PCB working machine of the present invention, as described hereinbefore, since the cut-working can be done in accordance with a continuous single stroke like cutting data, the elevating operation of the spindle can be remarkably reduced in its frequency, thus substantially eliminating the positional shifting of the spindle during the elevating operation and performing the cutting operation speedily with high accuracy. Furthermore, since the cutting tool is moved upward above the upper board by the operation of the tool mounting mechanism, the tool exchanging operation can be speedily performed, and since the structure of the spindle can be made simple and light in weight, the moving speed of the spindle can be made high without damaging the cutting performance.

Still furthermore, according to the present invention, the location of the spacers to the float surface of the float head ensures the constant gap between the float surface and the PCB substrate, thus maintaining constant the sticking amount of the cutting tool and hence performing the cutting working with the constant width.

It is to be noted that the present invention is not limited to the described embodiments and many other changes and modifications may be made without departing from the scope of the appended claims.

What is claimed is:

1. A printed circuit board working machine comprising:

a board plate provided with an opening;

a working table which is disposed above said board plate and on which a printed circuit board substrate is positioned and fixed;

a spindle which is disposed above said working table to be movable horizontally and vertically and to which a predetermined cutting tool is detachably mounted;

a chuck mounted to said spindle so as to detachably hold a predetermined cutting tool to the spindle;

a drive means for driving said spindle horizontally and vertically;

a drive control means for controlling the movement of said spindle in accordance with a predetermined cutting data;

a tool store for holding a plurality of tool holders to which cutting tools are held, respectively, said tool store having a portion disposed below the location of said working table;

a tool store control means for positioning said tool store to a predetermined position;

a tool exchanging means for exchanging the predetermined cutting tool held by said chuck with a cutting tool held by said tool holder at a portion corresponding to said opening of the board plate; and a tool holder elevating mechanism for raising a predetermined tool holder to a predetermined position at the cutting tool exchanging time.

2. A printed circuit board working machine according to claim 1, wherein said tool store comprises an index table provided with a plurality of through holes for detachably holding the tool holders, respectively, and wherein said tool holder elevating mechanism comprises an elevating member disposed to be movable up and down, said elevating member having a driver for driving the elevating member, a guide secured to a position corresponding to a tool holder holding hole at the cutting tool exchanging position and extending from the elevating member to a position in the vicinity of a lower surface of the index table, a push member secured to one end of the guide to push upward the tool holder, and a push bar guided by the guide to be movable up and down.

3. A printed circuit board working machine according to claim 2, further comprising a tool mounting mechanism disposed below the opening of the board plate, said tool mounting mechanism being provided with a support member, wherein a guide rail extending in an elevational direction is disposed on the support member and said elevating member is disposed to the guide rail with a slider.

4. A printed circuit board working machine according to claim 3, wherein said tool mounting mechanism comprises a support neck formed to the tool holder to be held by the through hole of the index table and an engaging member disposed movably to the elevating member and formed with an engaging member to be engaged with the support neck.

5. A printed circuit board working machine according to claim 3, wherein said tool mounting mechanism comprises a grip for gripping the tool holder and a driver for driving the grip to open and close.

* * * * *